(12) United States Patent
Lei et al.

(10) Patent No.: US 8,426,233 B1
(45) Date of Patent: Apr. 23, 2013

(54) METHODS OF PACKAGING MICROELECTROMECHANICAL RESONATORS

(75) Inventors: Kuolung Lei, San Jose, CA (US); Minfan Pai, Los Altos, CA (US); Wanling Pan, San Jose, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 96 days.

(21) Appl. No.: 13/077,312

(22) Filed: Mar. 31, 2011

Related U.S. Application Data

(63) Continuation-in-part of application No. 12/351,020, filed on Jan. 9, 2009, now Pat. No. 7,955,885.

(51) Int. Cl.
*H01L 21/00* (2006.01)

(52) U.S. Cl.
USPC ............................................. 438/51; 438/456

(58) Field of Classification Search .................... None
See application file for complete search history.

(56) References Cited

U.S. PATENT DOCUMENTS

| | | | |
|---|---|---|---|
| 7,172,911 B2 | 2/2007 | Kalvesten et al. | |
| 7,262,622 B2 * | 8/2007 | Zhao | 438/110 |
| 7,544,531 B1 * | 6/2009 | Grosjean | 438/50 |
| 7,737,409 B2 | 6/2010 | Deliwala et al. | |
| 7,923,790 B1 * | 4/2011 | Quevy et al. | 257/415 |
| 7,955,885 B1 * | 6/2011 | Bhugra et al. | 438/51 |
| 2004/0077117 A1 * | 4/2004 | Ding et al. | 438/51 |
| 2005/0142685 A1 | 6/2005 | Ouellet et al. | |
| 2005/0145962 A1 | 7/2005 | Ouellet | |
| 2005/0250238 A1 | 11/2005 | Ouellet | |
| 2006/0110895 A1 | 5/2006 | Ouellet et al. | |
| 2006/0166403 A1 | 7/2006 | Ouellet et al. | |
| 2006/0211163 A1 | 9/2006 | Ouellet et al. | |
| 2007/0015341 A1 | 1/2007 | Ouellet et al. | |
| 2007/0134927 A1 | 6/2007 | Fortin et al. | |
| 2007/0170529 A1 * | 7/2007 | Partridge et al. | 257/415 |
| 2007/0231943 A1 | 10/2007 | Ouellet et al. | |
| 2009/0029500 A1 | 1/2009 | Wan | |
| 2009/0302414 A1 | 12/2009 | Ebefors et al. | |
| 2010/0052107 A1 | 3/2010 | Bauer | |

(Continued)

OTHER PUBLICATIONS

Bauer, Tomas "Developing the Mid-End Foundry", A Silex Microsystems White Paper, Jul. 2011; 9 pages.

(Continued)

*Primary Examiner* — Scott B Geyer
(74) *Attorney, Agent, or Firm* — Myers Bigel et al.

(57) ABSTRACT

Methods of forming packaged microelectromechanical resonators include forming a first isolation trench in a first surface of a capping substrate, with the first isolation trench encircling a first portion of the capping substrate. The first isolation trench is filled with an electrically insulating material. The first surface of the capping substrate is bonded to a device substrate, which includes the microelectromechanical resonator and at least a first electrically conductive line connected to the microelectromechanical resonator. A second surface of the capping substrate is planarized for a sufficient duration to thereby expose the electrically insulating material and the first portion of the capping substrate encircled by the first isolation trench. The exposed first portion of the capping substrate is selectively etched to thereby define a through-substrate opening therein, which exposes a first portion of the first electrically conductive line. At least a portion of the through-substrate opening is filled with an electrically conductive through-substrate via, which is electrically connected to the first portion of the first electrically conductive line.

18 Claims, 10 Drawing Sheets

U.S. PATENT DOCUMENTS

2010/0053922 A1    3/2010  Ebefors et al.
2010/0072626 A1*   3/2010  Theuss et al. .................. 257/774
2010/0270630 A1*  10/2010  Fujii et al. ..................... 257/415
2011/0147859 A1*   6/2011  Tanaka et al. ................. 257/415

OTHER PUBLICATIONS

Bauer, Tomas First High Volume Via Process for Packaging and Integration of MEMS/CMOS; Retrieved from website: Oct. 9, 2011; http://www.silexmicrosystems.com/docs/Sil-ViaWithZeroCrosstalkFeature-FirstHighVolumeViaProcessForPackagingAndIntegrationOfMEMS&CMOS.pdf.

Silex Microsystems, "Advanced MEMS Process Technology", Retrieved from website: Oct. 9, 2011; http://www.silexmicrosystems.com/Technology.asp?active_page_id=107.

Silex Microsystems, "Functional Capping of MEMS and CMOS", Standard Packaging Process Technology; Retrieved from website: Oct. 9, 2011; http://www.silexmicrosystems.com/docs/Silex_Standard_Packaging_Process_Technologies.pdf.

* cited by examiner

US 8,426,233 B1

METHODS OF PACKAGING MICROELECTROMECHANICAL RESONATORS

REFERENCE TO PRIORITY APPLICATION

The present application is a continuation-in-part of U.S. application Ser. No. 12/351,020, filed Jan. 9, 2009, now U.S. Pat. No. 7,955,885, the disclosure of which is hereby incorporated herein by reference.

FIELD OF THE INVENTION

The present invention relates to methods of forming integrated circuit devices and, more particularly, to methods of forming microelectromechanical devices.

BACKGROUND OF THE INVENTION

Microelectronic circuits formed in integrated circuit chips are typically passivated using electrically insulating layers that are formed on the chips during back-end processing steps. These back-end processing steps may also include packaging the chips into a packaged integrated circuit device that protects the one or more chips from chemical contamination, thermal stresses, electrical and magnetic interference and other environmental influences. Notwithstanding these conventional techniques, there continues to be a need for improved packaging options for microelectronic circuits that may contain state-of-the-art devices, such as micro-electromechanical (MEMS) devices, which can be more susceptible to contamination and other environmental influences.

SUMMARY OF THE INVENTION

Methods of forming integrated circuit devices according to embodiments of the present invention include methods of forming packaged microelectromechanical resonators. According to some of these embodiments of the invention, a method of forming a microelectromechanical resonator can include forming a first isolation trench in a first surface of a capping substrate, with the first isolation trench encircling a first portion of the capping substrate. This first isolation trench may have the shape of a rectangular-shaped ring. The first isolation trench is then filled with an electrically insulating material (e.g., silicon dioxide). The first surface of the capping substrate is then bonded to a device substrate, which includes the microelectromechanical resonator and at least a first electrically conductive line/electrode connected to the microelectromechanical resonator. A second surface of the capping substrate is then planarized for a sufficient duration to thereby expose the electrically insulating material at a bottom of the first isolation trench and the first portion of the capping substrate encircled by the first isolation trench. The exposed first portion of the capping substrate is then selectively etched to thereby define a through-substrate opening therein, which may expose a first portion of the first electrically conductive line. At least a portion of the through-substrate opening is then filled with an electrically conductive through-substrate via, which is electrically connected to the first portion of the first electrically conductive line.

According to additional embodiments of the invention, the selectively etching may be preceded by depositing an electrically insulating dielectric layer on the planarized second surface of the capping substrate. Then, the selectively etching may include selectively etching through the dielectric layer and the first portion of the capping substrate to thereby define the through-substrate opening. The step of filling the through-substrate opening may include depositing a metal layer into the through-substrate opening and onto an upper surface of the dielectric layer and then patterning the deposited metal layer to thereby define a first bond pad on the dielectric layer, which is electrically connected to the through-substrate via. According to additional aspects of these embodiments of the invention, the bonding step may be preceded by a step of forming a polymer bonding layer on the first surface of the capping substrate. This bonding step may include bonding the polymer bonding layer directly to the device substrate containing the microelectromechanical resonator.

Methods of forming a packaged microelectromechanical resonator according to additional embodiments of the invention may include forming a first isolation trench in a first surface of a capping substrate. This first isolation trench may encircle a first portion of the capping substrate. The first isolation trench is filled with an electrically insulating material and then the first surface of the capping substrate is bonded to a device substrate, which includes the microelectromechanical resonator and at least a first electrically conductive line connected to the microelectromechanical resonator. A step is then performed to selectively etch through the first portion of the capping substrate to thereby define a through-substrate opening therein, which exposes a first portion of the first electrically conductive line. This through-substrate opening is then filled with an electrically conductive through-substrate via, which is electrically connected to the first portion of the first electrically conductive line. According to additional aspects of these embodiments of the invention, the step of selectively etching through the first portion of the capping substrate may be preceded by selectively etching a second isolation trench in a second surface of the capping substrate to thereby expose the electrically insulating material at a bottom of the first isolation trench. This second isolation trench may encircle a second portion of the capping substrate, which may be contiguous with the first portion of the capping substrate. A step may also be performed to deposit an electrically insulating dielectric layer on the second surface of the capping substrate and into the second isolation trench. This electrically insulating dielectric layer may directly contact the electrically insulating material at the bottom of the first isolation trench. In addition, the step of selectively etching through the first portion of the capping substrate may include selectively etching through the dielectric layer, the second portion of the capping substrate and the first portion of the capping substrate in sequence to thereby define the through-substrate opening. The filling may also include depositing a metal layer into the through-substrate opening and onto an upper surface of the dielectric layer and then patterning the deposited metal layer to thereby define a first bond pad on the dielectric layer.

Additional embodiments of the invention may include forming a packaged microelectromechanical resonator by forming a first isolation trench in a first surface of a semiconductor-on-insulator (SOI) capping substrate. This substrate includes a semiconductor capping layer on a buried insulating layer and the first isolation trench encircles a first portion of the semiconductor capping layer and exposes the buried insulating layer. The first isolation trench is filled with an electrically insulating material before the first surface of the SOI capping substrate is bonded to a device substrate, which includes the microelectromechanical resonator and at least a first electrically conductive line connected to the microelectromechanical resonator. A second surface of the SOI capping substrate is planarized for a sufficient duration to thereby expose the buried insulating layer. A step is then performed to selectively etch through the buried insulating layer and the first portion of the semiconductor capping layer to thereby define a through-substrate opening therein that exposes a first portion of the first electrically conductive line. At least a portion of the through-substrate opening is then filled with an electrically conductive through-substrate via, which is electrically connected to the first portion of the first electrically conductive line. This filling step may include depositing a metal layer into the through-substrate opening and onto an upper surface of the exposed buried insulating layer and then patterning the deposited metal layer to thereby define a first bond pad on the buried insulating layer. The bonding step may also be preceded by forming a polymer bonding layer on the first surface of the SOI capping substrate before bonding the polymer bonding layer directly to the device substrate.

DESCRIPTION OF PREFERRED EMBODIMENTS

Figure 1A:
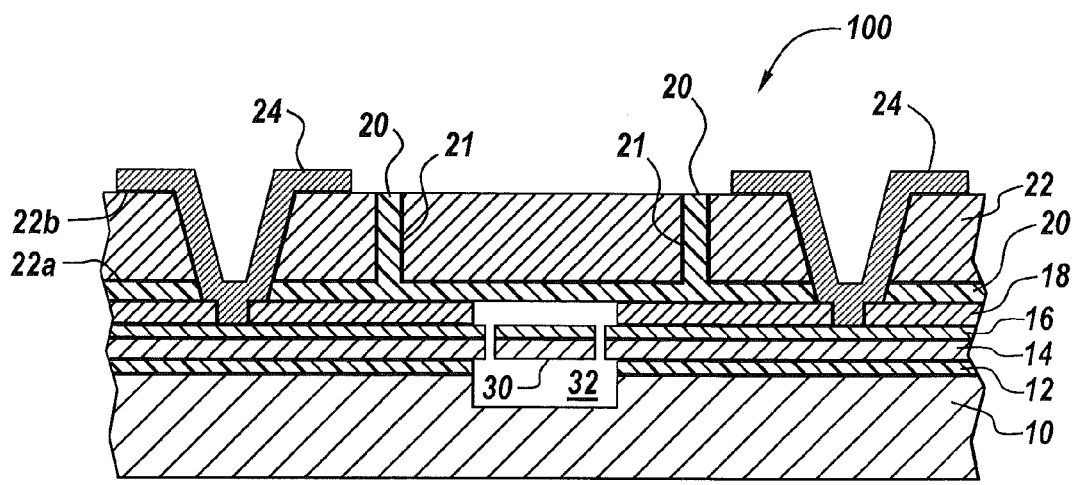
FIG. 1A is a cross-sectional view of a packaged microelectromechanical resonator, according to an embodiment of the present invention.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that when an element or layer is referred to as being "on," "connected to" or "coupled to" another element or layer (and variants thereof), it can be directly on, connected or coupled to the other element or layer or intervening elements or layers may be present. In contrast, when an element is referred to as being "directly on," "directly connected to" or "directly coupled to" another element or layer (and variants thereof), there are no intervening elements or layers present. Like reference numerals refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Embodiments of the present invention are described herein with reference to cross-section and perspective illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a sharp angle may be somewhat rounded due to manufacturing techniques/tolerances.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1B:
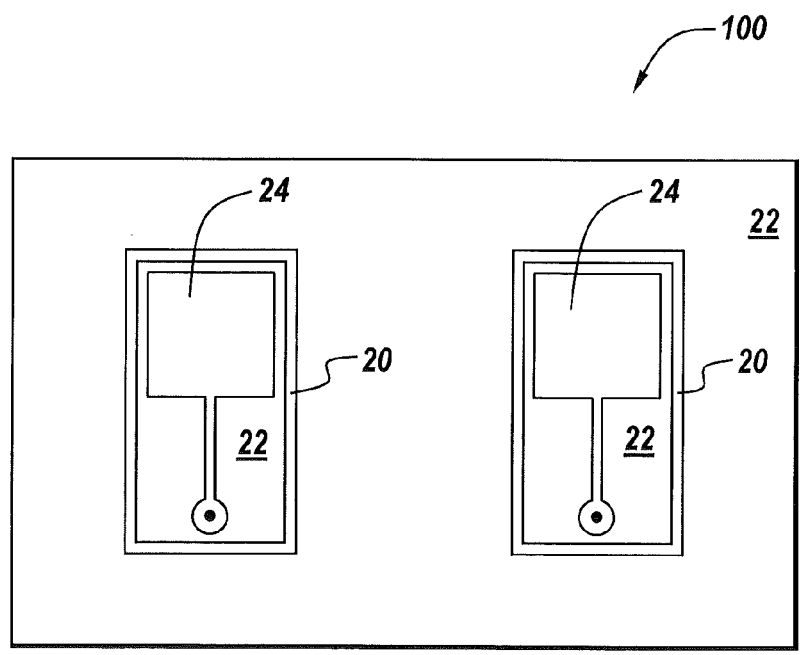
FIG. 1B is a plan view of the microelectromechanical resonator of FIG. 1A.

FIGS. 1A-1B illustrate a packaged microelectromechanical resonator 100 according to a first embodiment of the present invention. As illustrated by FIG. 1A, a packaged microelectromechanical resonator 100 may include a device substrate 10 (e.g., silicon substrate) having a plurality of layers thereon. The plurality of layers may include an electrically insulating layer 12, a resonator body layer 14, which may be a monocrystalline silicon layer, and an active layer 16. According to some embodiments of the present invention, the active layer 16 may be a composite of a piezoelectric layer (e.g., AlN) sandwiched between upper and lower electrode layers, which may be molybdenum (Mo) layers. This active layer 16 and the resonator body layer 14 may be patterned to define a resonator body 30, which is suspended opposite a cavity/recess 32 by at least one pair of tethers. As illustrated and described more fully by U.S. Pat. Nos. 7,924,119, 7,888, 843, 7,871,857, 7,843,284, 7,842,613, 7,834,524, 7,800,282 and 7,639,105, U.S. Patent Publication No. 2010/0319185 and U.S. application Ser. Nos. 12/508,257, filed Jul. 23, 2009, and 12/393,566, filed Feb. 26, 2009, the disclosures of which are hereby incorporated herein by reference, the upper electrode layer may be a metal layer that is patterned to define input and output electrodes (as electrically conductive lines) and the lower electrode layer may be biased at a reference voltage (e.g., ground voltage). These input and output electrodes may be patterned as interdigitated electrodes that extend on a top surface of the suspended resonator body, as described in the aforementioned patents, including U.S. Pat. No. 7,942,119.

The suspended resonator body 30 may be encapsulated (e.g., hermetically sealed) within a cavity that shares an ambient with the cavity/recess 32, by bonding the active layer 16 to a capping substrate 22 using, for example, a polymer bonding layer 18. As described more fully hereinbelow, the capping substrate 22 (e.g., silicon layer) may include a first isolation trench 21 therein at a first surface 22a thereof, which is filled with an electrically insulating material 20 (e.g., silicon dioxide). Electrically conductive through-substrate vias 24 may also be provided, which extend through a second surface 22b of the capping substrate 22 and make electrical contact to electrodes/terminals of the resonator and/or resonator circuitry coupled to the suspended resonator body 30, which may take the form of electrically conductive lines. The vias 24 may be formed by depositing a metal layer into openings in the capping substrate 22 (and onto electrically isolated regions within the capping substrate 22) and then patterning the metal layer to define spaced-apart through-substrate vias and bond/contact pads 24. These bond/contact pads 24 are electrically isolated from each other by the insulator-filled isolation trenches 21, as illustrated by FIG. 1B.

Figure 1C:
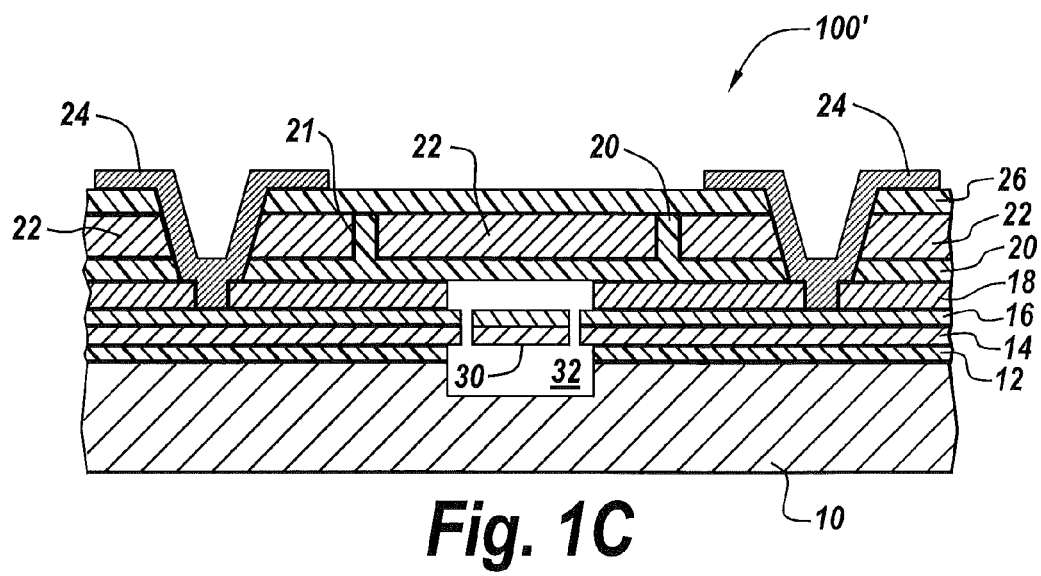
FIG. 1C is a cross-sectional view of a packaged microelectromechanical resonator, according to an embodiment of the present invention.
Figure 1D:
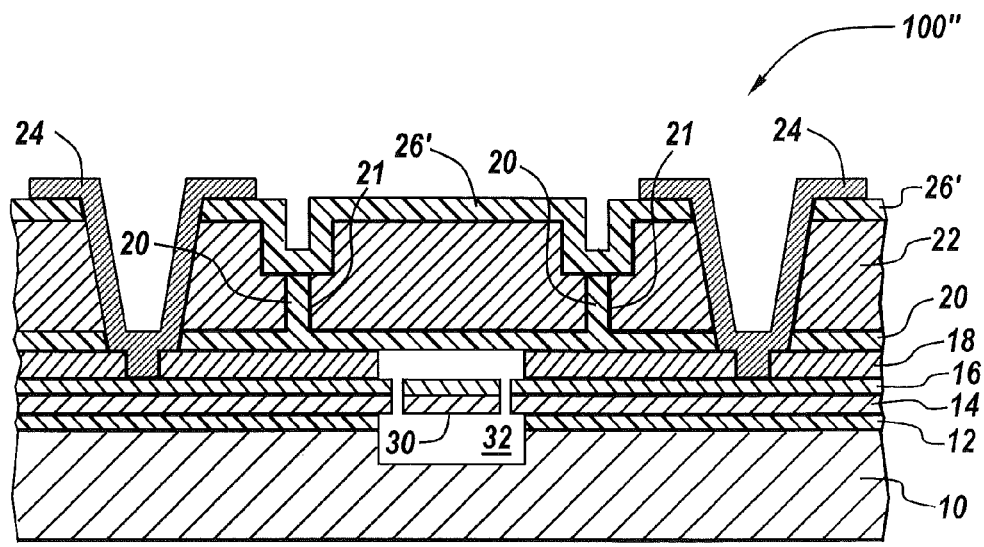
FIG. 1D is a cross-sectional view of a packaged microelectromechanical resonator, according to an embodiment of the present invention.
Figure 3A:
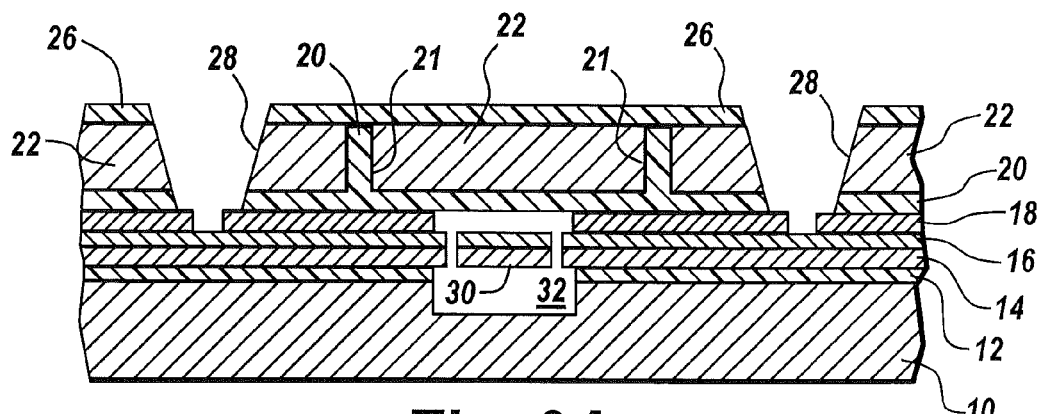
FIGS. 3A-3B are cross-sectional views of intermediate structures that illustrate methods of forming the microelectromechanical resonator of FIG. 1C, according to embodiments of the present invention.
Figure 3B:
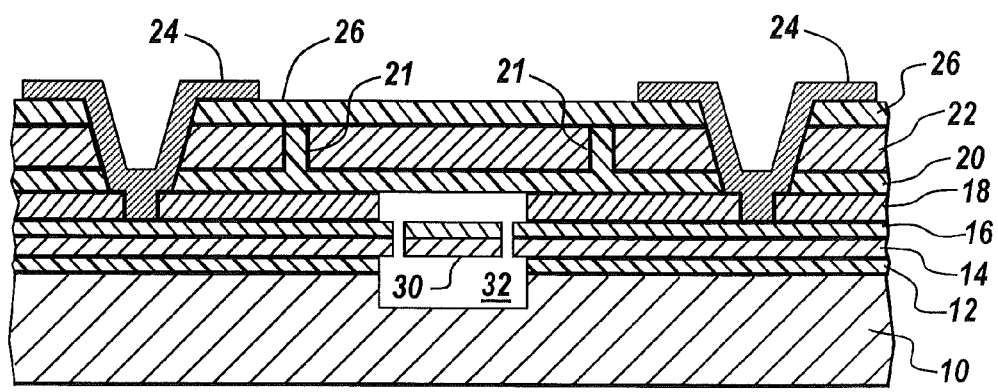

Referring now to FIG. 1C, a packaged microelectromechanical resonator 100' according to a second embodiment of the present invention is similar to the embodiment of FIGS. 1A-1B, however, the steps illustrated by FIGS. 3A-3B are performed to define an electrically insulating layer 26 on a top surface of the capping substrate 22 prior to the formation of the through-substrate vias and bond/contact pads 24. Referring now to FIG. 1D, a packaged microelectromechanical resonator 100" according to a third embodiment of the present invention is similar to the embodiment of FIG. 10, however, the steps illustrated by FIGS. 4A-4F are performed to define a conformal electrically insulating layer 26' on a top surface of the capping substrate 22 prior to the formation of the through-substrate vias and bond/contact pads 24.

Figure 2A:
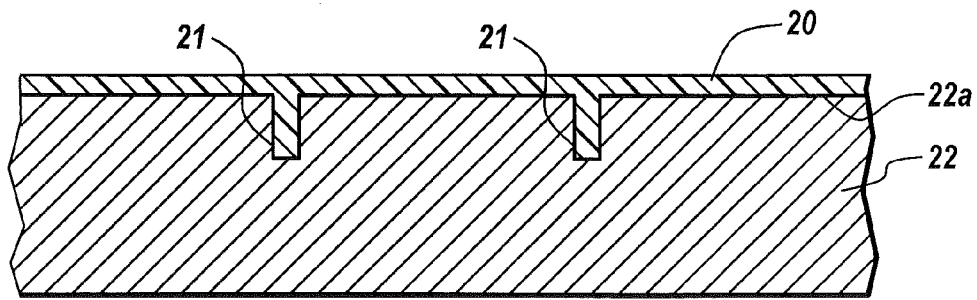
FIGS. 2A-2F are cross-sectional views of intermediate structures that illustrate methods of forming the microelectromechanical resonator of FIG. 1A, according to embodiments of the present invention.
Figure 2B:
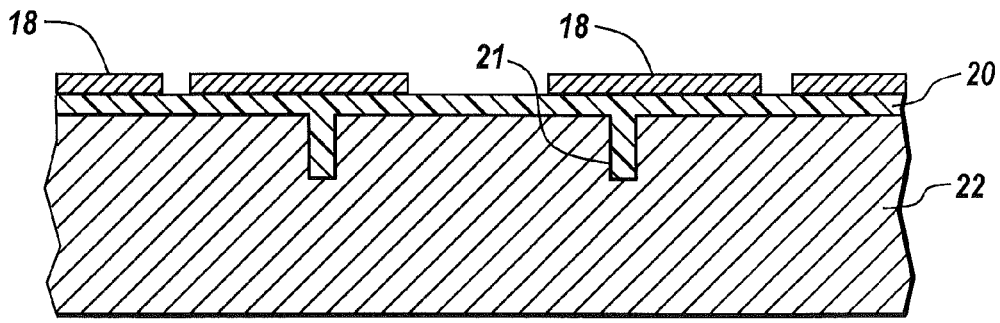
Figure 2C:
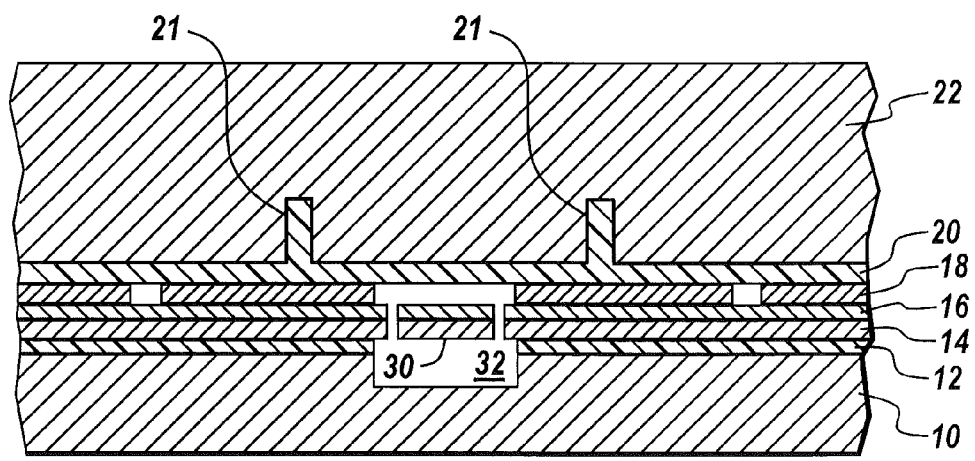

Referring now to FIGS. 2A-2F, methods of forming the microelectromechanical resonator of FIG. 1A include forming a first isolation trench 21 in a first surface of a capping substrate 22, with the first isolation trench 21 encircling a first portion of the capping substrate 22. This first isolation trench may be a rectangular ring-shaped trench according to some embodiments of the present invention. The first isolation trench 21 is then filled with an electrically insulating material (e.g., silicon dioxide) by depositing an electrically insulating layer 20 into the trench and onto an upper surface of the capping substrate 22, as illustrated by FIG. 2A. Referring now to FIG. 2B, a bonding layer 18 is formed on the electrically insulating layer 20 by depositing and patterning a polymer bonding layer 18 on an upper surface of the electrically insulating layer 20. As illustrated by FIG. 2C, a first (e.g., upper) surface of the capping layer 22 is then bonded to a device substrate, which contains a microelectromechanical resonator, by bonding the polymer bonding layer 18 directly to the active layer 16. As described above with respect to FIGS. 1A-1B, the active layer 16 can include a composite of a piezoelectric layer (e.g., AlN) sandwiched between upper and lower electrode layers. The upper electrode layer may include at least a first electrically conductive line (e.g., patterned electrode), which is connected to the microelectromechanical resonator. As further illustrated by FIG. 2C, the active layer 16 is provided on the resonator body layer 14, which is provided on the underlying electrically insulating layer 12 and the device substrate 10.

Figure 2D:
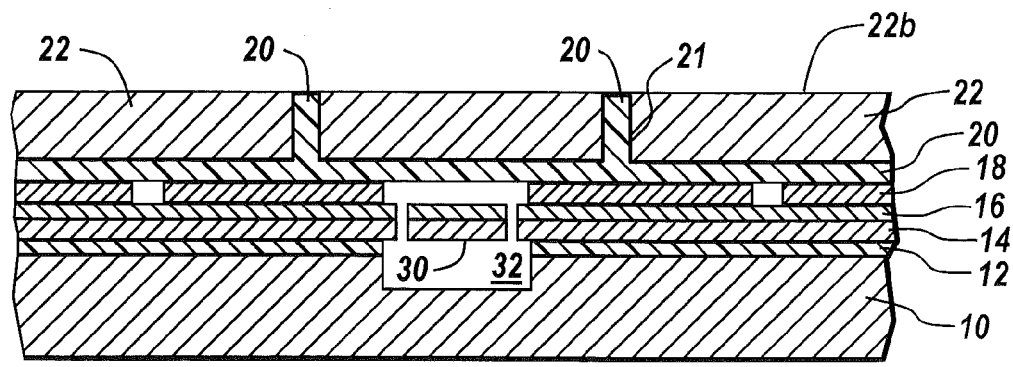
Figure 2E:
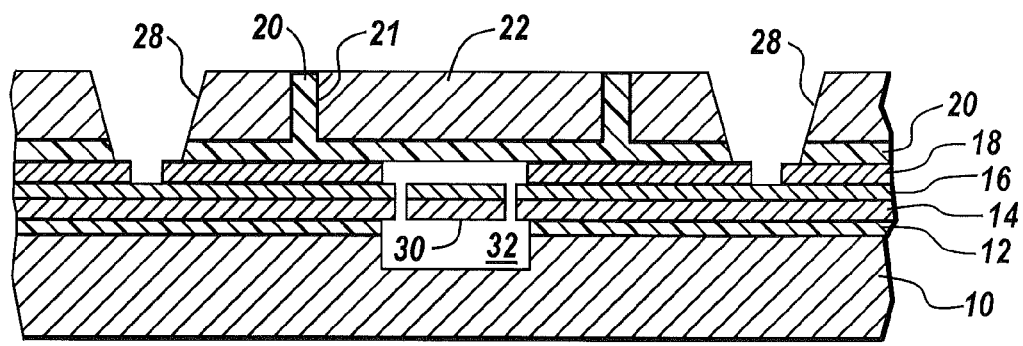
Figure 2F:
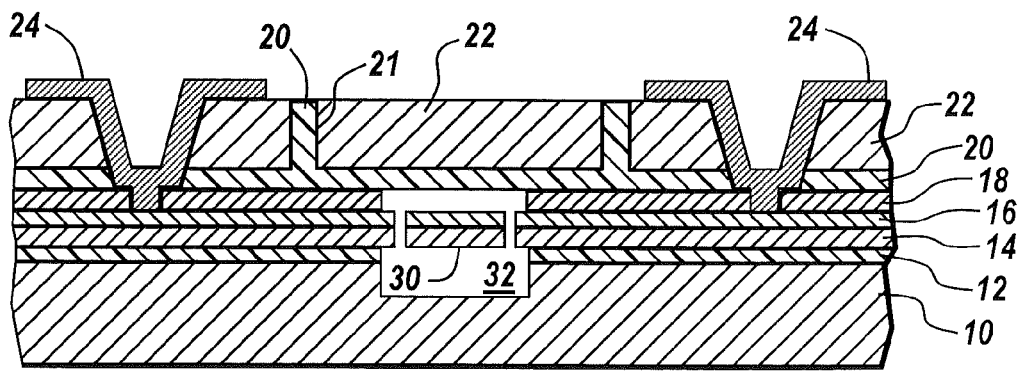

Referring now to FIG. 2D, a second surface of the capping substrate 22 is planarized for a sufficient duration to thereby expose the electrically insulating material 20 and the first portion of the capping substrate encircled by the first isolation trenches 21. This planarization step may be performed using a technique such as wafer grinding, for example. The exposed first portion of the capping substrate 22 is then selectively etched to thereby define through-substrate openings 28 to the active layer 16, as illustrated by FIG. 2E. These openings 28 expose respective portions of electrically conductive lines that are electrically coupled to the microelectromechanical resonator. As illustrated by FIG. 2F, the through-substrate openings 28 are filled with electrically conductive through-substrate vias 24, which are electrically connected to respective electrically conductive lines. This step of filling the through-substrate openings 28 may include depositing a metal layer into the through-substrate openings 28 and onto an upper surface of the capping substrate 22 and then patterning the deposited metal layer to thereby define a plurality of bond pads that are lateral extensions of the through-substrate vias.

FIGS. 2A-2D and 3A-3B illustrate methods of forming microelectromechanical resonators according to additional embodiments of the invention. In particular, FIG. 3A illustrates the deposition of an electrically insulating dielectric layer 26 on the planarized second surface of the capping substrate 22 of FIG. 2D. This deposition is followed by selectively etching through the dielectric layer 26 and the first portion of the capping substrate 22 to thereby define the through-substrate opening 28, which exposes the active layer 16. Thereafter, as illustrated by FIG. 3B, the through-substrate openings 28 are filled with electrically conductive through-substrate vias 24, which are electrically connected to respective electrically conductive lines within the active layer 16. This step of filling the through-substrate openings 28 may include depositing a metal layer into the through-substrate openings 28 and onto an upper surface of the dielectric layer 26 and then patterning the deposited metal layer to thereby define a plurality of bond pads that are lateral extensions of the through-substrate vias 24. These bond pads may be sufficiently large to overlap the isolation trenches 21.

Figure 4A:
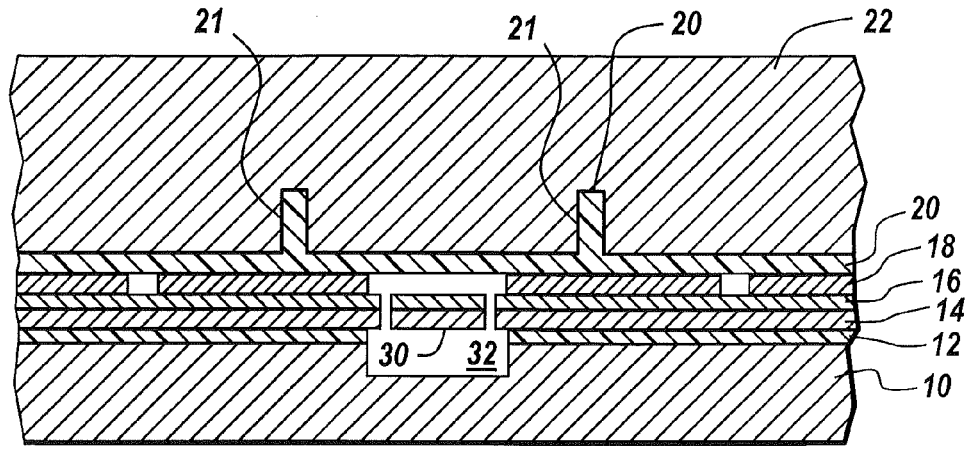
FIGS. 4A-4F are cross-sectional views of intermediate structures that illustrate methods of forming the microelectromechanical resonator of FIG. 1D, according to embodiments of the present invention.

Referring now to FIGS. 2A-2B and FIGS. 4A-4F, methods of forming microelectromechanical resonators may also include forming a first isolation trench 21 in a first surface of a capping substrate 22, with the first isolation trench 21 encircling a first portion of the capping substrate 22. The first isolation trench 21 is then filled with an electrically insulating material (e.g., silicon dioxide) by depositing an electrically insulating layer 20 into the trench and onto an upper surface of the capping substrate 22, as illustrated by FIG. 2A. A bonding layer 18 is formed on the electrically insulating layer 20 by depositing and patterning a polymer bonding layer 18 on an upper surface of the electrically insulating layer 20. As illustrated by FIG. 4A, a first (e.g., upper) surface of the capping layer 22 is then bonded to a device substrate, which contains a microelectromechanical resonator, by bonding the polymer bonding layer 18 directly to the active layer 16.

Figure 4B:
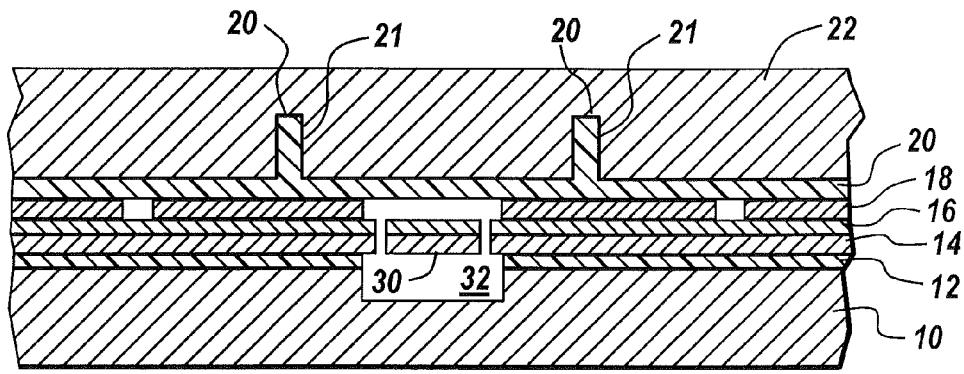
Figure 4C:
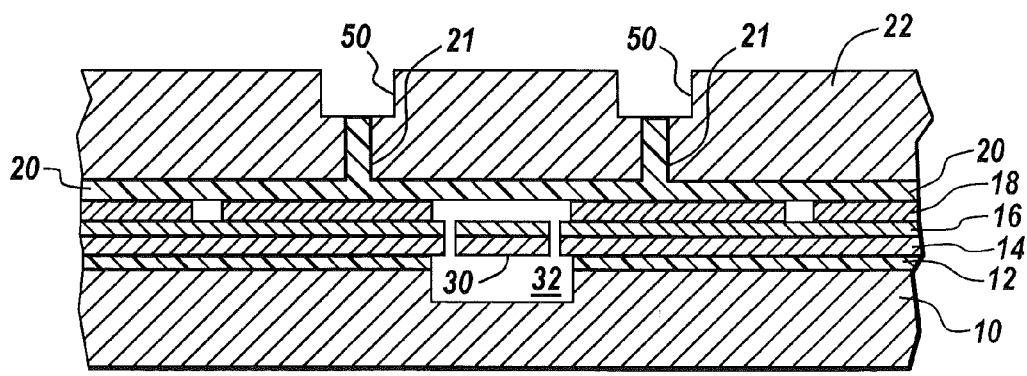
Figure 4D:
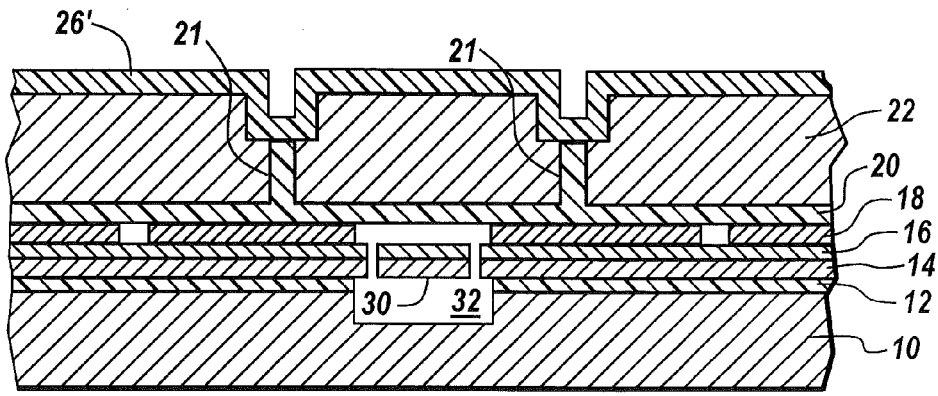
Figure 4E:
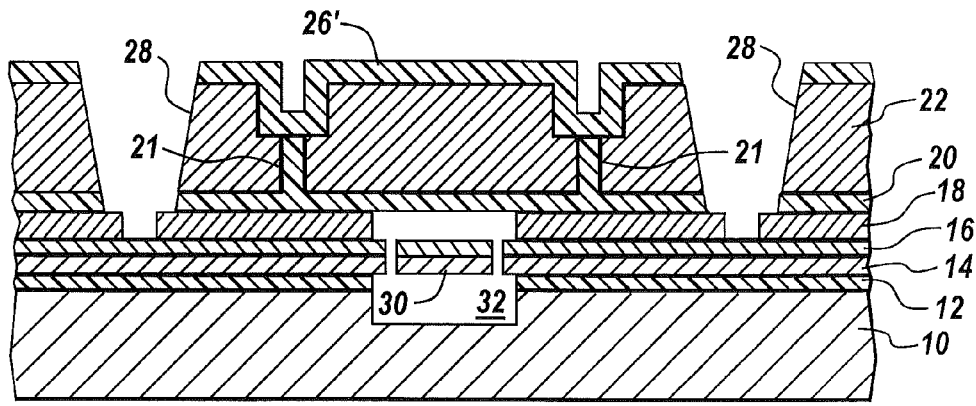
Figure 4F:
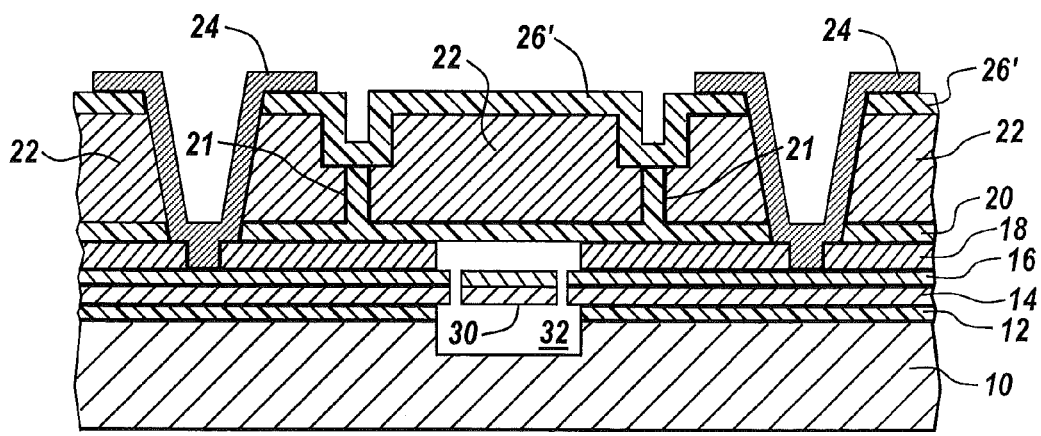

Referring now to FIGS. 4B-4C, the capping substrate 22 is initially thinned by planarizing a second surface of the capping substrate 22 and then a selective etching step is performed to define additional isolation trenches 50 in the second surface. These isolation trenches 50 may be sufficiently deep to expose the electrically insulating material 20 at bottoms of the first isolation trenches 21. These second isolation trenches may encircle second portions of the capping substrate 22 that are aligned vertically with the first portions of the capping substrate 22. As illustrated by FIG. 4D, a step is then performed to deposit an electrically insulating dielectric layer 26' on the second surface of the capping substrate 22 and into the second isolation trench 50. This electrically insulating dielectric layer 26' may directly contact the electrically insulating material 20 at the bottoms of the first isolation trenches 21. Referring now to FIGS. 4E-4F, the second surface of the capping substrate 22 is then selectively etched to define through-substrate openings 28 to the active layer 16, which expose respective portions of electrically conductive lines that are electrically coupled to the microelectromechanical resonator. The through-substrate openings 28 are then filled with electrically conductive through-substrate vias 24, which are electrically connected to respective electrically conductive lines within the active layer 16. This step of filling the through-substrate openings 28 may include depositing a metal layer into the through-substrate openings 28 and onto an upper surface of the dielectric layer 26' and then patterning the deposited metal layer to thereby define a plurality of bond pads that are lateral extensions of the through-substrate vias 24. These bond pads may be sufficiently large to overlap the isolation trenches 21.

Figure 5A:
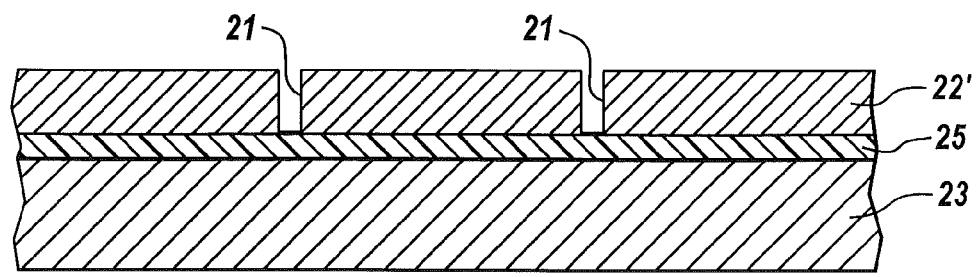
FIGS. 5A-5G are cross-sectional views of intermediate structures that illustrate methods of forming microelectromechanical resonators according to embodiments of the present invention.
Figure 5B:
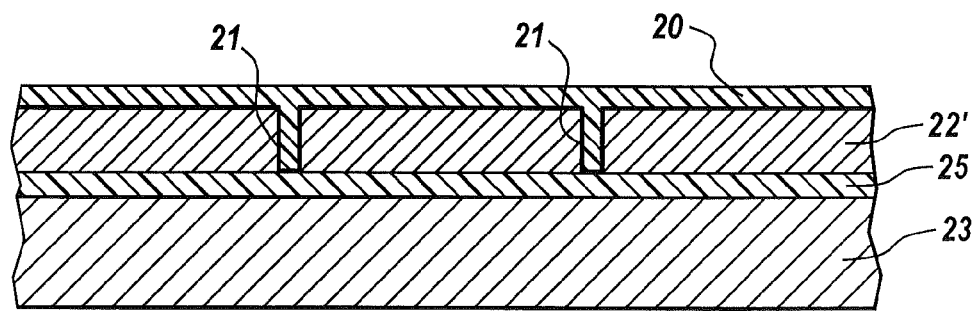
Figure 5C:
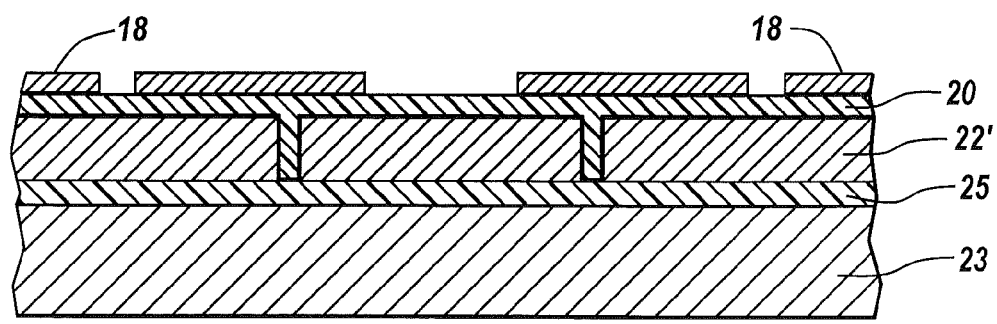
Figure 5D:
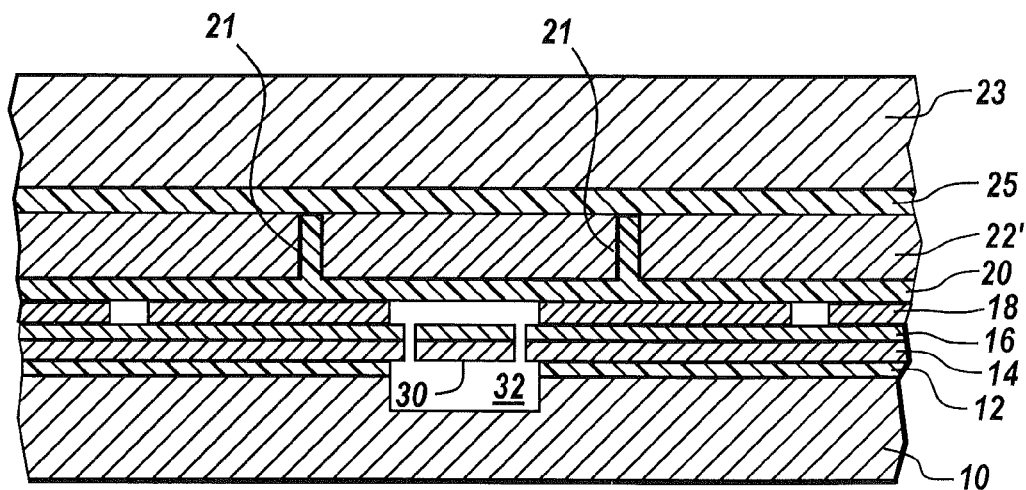

FIGS. 5A-5G illustrate the use of semiconductor-on-insulator (SOI) substrates as capping layers in methods of forming microelectromechanical resonators. As shown by FIG. 5A, a first isolation trench 21 is formed in a first surface of a semiconductor-on-insulator (SOI) capping substrate, which includes a semiconductor capping layer 22' and a buried insulating layer 25 extending between the capping layer 22' and an underlying semiconductor handling substrate 23. The first isolation trench 21 encircles a first portion of the capping layer 22'. As shown by FIGS. 5B-5C, the first isolation trench 21 is filled with an electrically insulating material (e.g., silicon dioxide) by depositing an electrically insulating layer 20 into the trench and onto an upper surface of the capping layer 22'. A bonding layer 18 is formed on the electrically insulating layer 20 by depositing and patterning a polymer bonding layer on an upper surface of the electrically insulating layer 20. As illustrated by FIG. 5D, an upper surface of the capping layer 22' is then bonded to a device substrate, which contains a microelectromechanical resonator, by bonding the polymer bonding layer 18 directly to an active layer 16 within the device substrate. As described hereinabove, the active layer 16 is provided on the resonator body layer 14, which is provided on the underlying electrically insulating layer 12 and the device substrate 10.

Figure 5E:
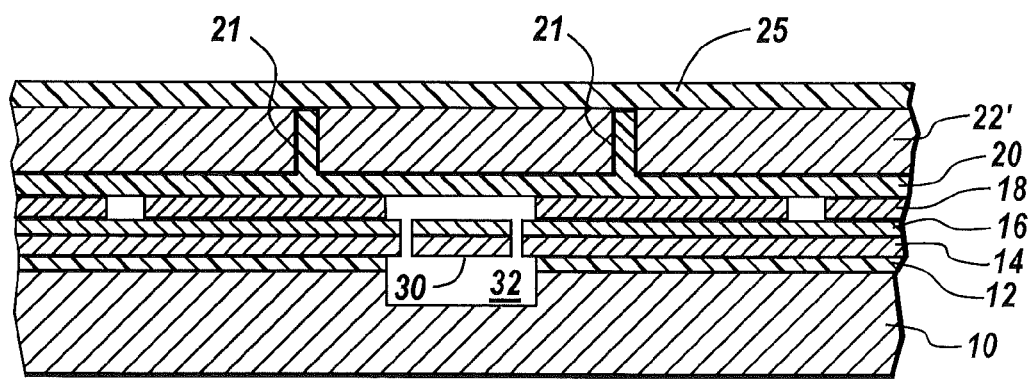
Figure 5F:
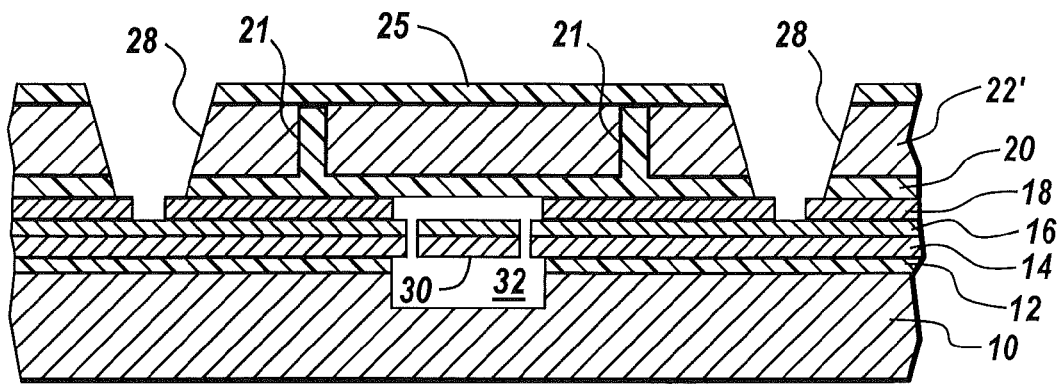
Figure 5G:
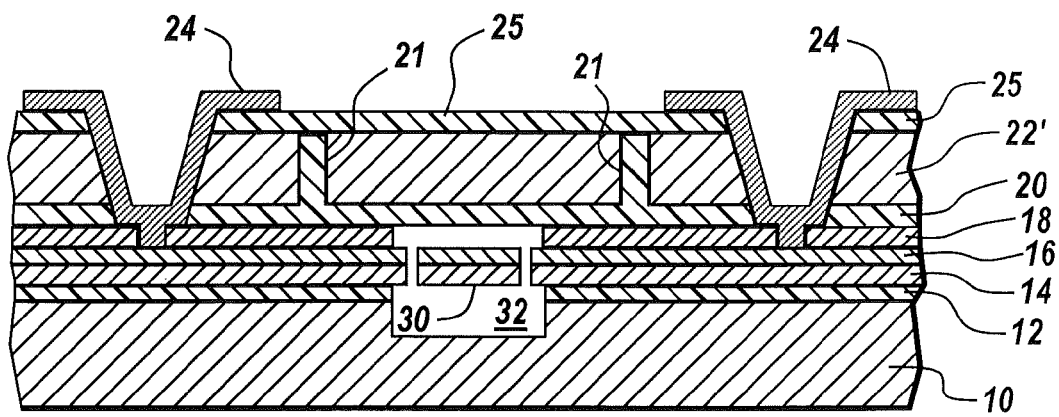

Referring now to FIG. 5E, the semiconductor handling substrate 23 is removed (e.g., by wafer grinding) to thereby expose the buried insulating layer 25, which performs the same electrically insulating function as the electrically insulating dielectric layer 26 of FIG. 1C. The exposed buried insulating layer 25 and the capping layer 22' are then selectively etched to thereby define through-substrate openings 28 to the active layer 16, as illustrated by FIG. 5F. These openings 28 expose respective portions of electrically conductive lines (within the active layer 16) that are electrically coupled to the microelectromechanical resonator. As illustrated by FIG. 5G, the through-substrate openings 28 are filled with electrically conductive through-substrate vias 24, which are electrically connected to respective electrically conductive lines. This step of filling the through-substrate openings 28 may include depositing a metal layer into the through-substrate openings 28 and onto an upper surface of the buried insulating layer 25 and then patterning the deposited metal layer to thereby define a plurality of bond pads that are lateral extensions of the through-substrate vias.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of forming a packaged microelectromechanical resonator, comprising:
    forming a first isolation trench in a first surface of a capping substrate, said first isolation trench encircling a first portion of the capping substrate;
    filling the first isolation trench with an electrically insulating material;
    bonding the first surface of the capping substrate to a device substrate comprising the microelectromechanical resonator and at least a first electrically conductive line connected to the microelectromechanical resonator;
    selectively etching through the first portion of the capping substrate to thereby define a through-substrate opening therein that exposes a first portion of the first electrically conductive line; and
    filling at least a portion of the through-substrate opening with an electrically conductive through-substrate via that is electrically connected to the first portion of the first electrically conductive line.

2. The method of claim 1, wherein said filling at least a portion of the through-substrate opening comprises depositing a metal layer into the through-substrate opening and onto an upper surface of the dielectric layer and then patterning the deposited metal layer to thereby define a first bond pad on the dielectric layer.

3. The method of claim 1, wherein the first isolation trench is a ring-shaped trench that encircles the first portion of the capping substrate.

4. The method of claim 1, wherein the first isolation trench is a square ring-shaped trench that encircles the first portion of the capping substrate.

5. A method of forming a packaged microelectromechanical resonator, comprising:
    forming a first isolation trench in a first surface of a capping substrate, said first isolation trench encircling a first portion of the capping substrate;
    filling the first isolation trench with an electrically insulating material;
    bonding the first surface of the capping substrate to a device substrate comprising the microelectromechanical resonator and at least a first electrically conductive line connected to the microelectromechanical resonator;

selectively etching a second isolation trench in a second surface of the capping substrate to thereby expose the electrically insulating material at a bottom of the first isolation trench, said second isolation trench encircling a second portion of the capping substrate; and depositing an electrically insulating dielectric layer on the second surface of the capping substrate and into the second isolation trench, said electrically insulating dielectric layer contacting the electrically insulating material at the bottom of the first isolation trench;

selectively etching through the first portion of the capping substrate to thereby define a through-substrate opening therein that exposes a first portion of the first electrically conductive line; and filling at least a portion of the through-substrate opening with an electrically conductive through-substrate via that is electrically connected to the first portion of the first electrically conductive line.

6. The method of claim 5, wherein said selectively etching through the first portion of the capping substrate comprises selectively etching through the dielectric layer, the second portion of the capping substrate and the first portion of the capping substrate to thereby define the through-substrate opening.

7. The method of claim 6, wherein said filling comprises depositing a metal layer into the through-substrate opening and on an upper surface of the dielectric layer and then patterning the deposited metal layer to thereby define a first bond pad on the dielectric layer.

8. The method of claim 5, wherein the first isolation trench is a ring-shaped trench that encircles the first portion of the capping substrate.

9. The method of claim 5, wherein the first isolation trench is a square ring-shaped trench that encircles the first portion of the capping substrate.

10. A method of forming a packaged microelectromechanical resonator, comprising:

forming a first isolation trench in a first surface of a semiconductor-on-insulator (SOI) capping substrate comprising a semiconductor capping layer on a buried insulating layer, said first isolation trench encircling a first portion of the semiconductor capping layer and exposing the buried insulating layer;

filling the first isolation trench with an electrically insulating material;

bonding the first surface of the SOI capping substrate to a device substrate comprising the microelectromechanical resonator and at least a first electrically conductive line connected to the microelectromechanical resonator;

planarizing a second surface of the SOI capping substrate for a sufficient duration to thereby expose the buried insulating layer;

selectively etching through the buried insulating layer and the first portion of the semiconductor capping layer to thereby define a through-substrate opening therein that exposes a first portion of the first electrically conductive line; and filling at least a portion of the through-substrate opening with an electrically conductive through-substrate via that is electrically connected to the first portion of the first electrically conductive line.

11. The method of claim 10, wherein said filling comprises depositing a metal layer into the through-substrate opening and onto an upper surface of the exposed buried insulating layer and then patterning the deposited metal layer to thereby define a first bond pad on the buried insulating layer.

12. The method of claim 10, wherein said bonding is preceded by forming a polymer bonding layer on the first surface of the SOI capping substrate; and wherein said bonding comprises bonding the polymer bonding layer directly to the device substrate.

13. A method of forming a packaged microelectromechanical resonator, comprising:

forming a first isolation trench in a first surface of a capping substrate, said first isolation trench encircling a first portion of the capping substrate;

filling the first isolation trench with an electrically insulating material;

bonding the first surface of the capping substrate to a device substrate comprising the microelectromechanical resonator and at least a first electrically conductive line connected to the microelectromechanical resonator;

planarizing a second surface of the capping substrate;

selectively etching through the first portion of the capping substrate to thereby define a through-substrate opening therein that exposes a first portion of the first electrically conductive line; and filling at least a portion of the through-substrate opening with an electrically conductive through-substrate via that is electrically connected to the first portion of the first electrically conductive line.

14. The method of claim 13, wherein said selectively etching is preceded by depositing an electrically insulating dielectric layer on the planarized second surface of the capping substrate; and wherein said selectively etching comprises selectively etching through the dielectric layer and the first portion of the capping substrate to thereby define the through-substrate opening.

15. The method of claim 13, wherein the first isolation trench is a ring-shaped trench that encircles the first portion of the capping substrate.

16. The method of claim 13, wherein the first isolation trench is a square ring-shaped trench that encircles the first portion of the capping substrate.

17. A method of forming a packaged microelectromechanical resonator, comprising:

forming a first isolation trench in a first surface of a capping substrate, said first isolation trench encircling a first portion of the capping substrate;

filling the first isolation trench with an electrically insulating material;

forming a polymer bonding layer on the first surface of the capping substrate; bonding the polymer bonding layer directly to a device substrate comprising the microelectromechanical resonator and at least a first electrically conductive line connected to the microelectromechanical resonator;

selectively etching through the first portion of the capping substrate to thereby define a through-substrate opening therein that exposes a first portion of the first electrically conductive line; and filling at least a portion of the through-substrate opening with an electrically conductive through-substrate via that is electrically connected to the first portion of the first electrically conductive line.

18. The method of claim 17, wherein the first isolation trench is a ring-shaped trench that encircles the first portion of the capping substrate.

* * * * *